(12) United States Patent
Pan et al.

(10) Patent No.: US 6,972,230 B1
(45) Date of Patent: Dec. 6, 2005

(54) METHOD FOR FABRICATING A FLOATING GATE MEMORY DEVICE

(75) Inventors: Shyi-Shuh Pan, Kaohsiung (TW); Chong-Jen Huang, Hsin-chi (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/865,401

(22) Filed: Jun. 10, 2004

(51) Int. Cl.[7] .................................... H01L 21/336
(52) U.S. Cl. .................... 438/257; 438/294; 438/303
(58) Field of Search ................. 438/257, 266, 438/267, 288, 294, 295, 296, 303

(56) References Cited

U.S. PATENT DOCUMENTS

| | | | |
|---|---|---|---|
| 5,399,891 A | 3/1995 | Yiu et al. | |
| 5,696,019 A | 12/1997 | Yun | |
| 6,248,633 B1 | 6/2001 | Ogura et al. | |
| 6,271,090 B1 | 8/2001 | Huang et al. | |
| 6,366,500 B1 | 4/2002 | Ogura et al. | |
| 6,420,237 B1 | 7/2002 | Chang | |
| 6,461,906 B1 | 10/2002 | Lung | |
| 6,465,306 B1 * | 10/2002 | Ramsbey et al. | ............ 438/279 |
| 6,479,859 B2 | 11/2002 | Hsieh et al. | |
| 6,493,264 B2 | 12/2002 | Yamauchi | |
| 6,551,880 B1 | 4/2003 | Lai et al. | |
| 6,573,140 B1 | 6/2003 | Ogura et al. | |
| 6,720,610 B2 * | 4/2004 | Iguchi et al. | ............ 257/315 |

* cited by examiner

*Primary Examiner*—Phuc T. Dang
(74) *Attorney, Agent, or Firm*—Haynes Beffel & Wolfeld LLP (57) ABSTRACT

Roughly described, a device having twin bit floating gate memory cells is fabricated by first providing a substrate having formed thereon, within a memory area, a composite charge storage film and a protective liner layer over the composite film. The memory area further includes oxide features over buried diffusion regions in the substrate, and polysilicon spacers over the composite film against the sidewalls of the oxide features. The method further involves etching an isolation trench through the composite film laterally between two of the oxide features, using the polysilicon spacers as a mask, and forming an insulator in the trench. A gate conductor is then formed overlying both the composite film and the filled isolation trench between the two oxide features.

45 Claims, 7 Drawing Sheets

METHOD FOR FABRICATING A FLOATING GATE MEMORY DEVICE

BACKGROUND

1. Field of the Invention

The invention relates to the fabrication of floating gate memory devices, and more particularly to the fabrication of twin bit cell memory devices that can also incorporate logic.

2. Description of Related Art

A read only memory (ROM), comprising a plurality of memory cells, is a semiconductor device with a primary function of memory storage. ROMs can be made mask programmable, field programmable (PROM), erasable (EPROM), or electrically erasable (EEPROM). A Flash memory is an EEPROM memory device, but due to a simplified array structure, it achieves significantly higher density and lower cost. The simplified array structure means flash memories are slower to write, and can be erased only on a sector-by-sector basis, but these drawback have not prevented flash memories from dramatically increased deployment in numerous kinds of systems.

Flash memory cells and other EEPROM cells use a floating gate below the control gate in order to store charge. The floating gate can be polysilicon or metal, for example. A nitride read only memory (NROM) differs from other types of EEPROM cells by using a silicon nitride dielectric layer as the charge-trapping medium. Due to a highly-compacted nature of the nitride layer, hot electrons tunneling from the MOS transistor into the silicon nitride layer are trapped to form an unequal concentration distribution so as to increase data reading speed and avoid current leakage.

Each memory cell of a nitride-based flash memory array includes a source and a drain formed in a semiconductor substrate. A bottom oxide, a nitride, and a top oxide (an ONO structure) are formed on the surface of the semiconductor substrate laterally between the source and the drain, thereby forming a floating gate for storing charge. A control gate for controlling access to data is formed above the ONO structure.

The state of a flash memory depends on the charge density of the floating gate, and the operation thereof depends on the technique of injecting charges into or removing charges from the floating gate. Therefore, when program data is written in, a high voltage is applied to the control gate to let hot electrons pass through the oxide from the drain and be injected into the nitride of the floating gate, hence enhancing the threshold voltage to read data. When erasing data, hot hole injection is used to let holes enter the nitride of the floating gate and reach the same positions of the above electrons to compensate the electrons, hence achieving the object of erase.

In early EEPROM memory devices, including early flash memories, each memory cell could store only one data bit. Soon twin bit cells were developed, in which each cell could store two bits of data, one at each end of the channel. The source diffusion was used in programming one of the bits, and the drain diffusion was used in programming the other. Twin bit cell designs were aided by the use of dielectric charge trapping materials such as silicon nitride. But this solution was imperfect because despite the dielectric nature of the nitride, charge tended to leak along the common nitride layer from one charge storage region toward the other, resulting in crosstalk. In addition, since electrons and holes spread differently in the nitride layer, hole injection on erase did not always completely overlap the charged regions of the nitride, resulting in incomplete erasure.

In order to solve these problems, many flash memory structures have included an isolation region in the nitride layer laterally between the two charge storage regions. In some devices, the isolation region was created by implanting certain ions into a laterally central region between the two charge storage regions, in order to increasing the insulating capacity of the layer within that region. In other devices, the isolation region was created by etching through the ONO in the central region.

The various methods that have been developed for fabricating twin bit flash memory devices with a split charge storage layer still suffer from several deficiencies. As one example, some of the prior art methods produce charge trapping regions that are curved in shape, with varying vertical thickness. This structure can induce a weak and un-controlled electron field for electron/hole injection location control.

Other prior art methods may produce flat charge trapping regions with constant vertical thickness, but do not integrate well into the fabrication process used for the logic areas of the device. In particular, for example, the integration of certain flash memory processes into the logic process results in a less than optimal relationship between the thickness of the top ONO oxide layer and the thickness of the gate oxide layer of logic transistors. As another example, in certain logic processes, it is necessary to clean the top surface of the gate oxide while the delicate top ONO oxide layer is exposed, thereby damaging the delicate top ONO oxide layer.

Yet other prior art methods involve a step of etching through the ONO layer to form the twin bit isolation regions, but that etch also damages the delicate top oxide layer of the ONO segments that are to remain.

Yet other prior art methods require the use of additional photolithographic masking steps, which tend to limit the density of memory cells achievable. In addition, if masking steps are used to define the lateral location of the twin bit isolation regions relative to the length of the ONO layer, then small misalignments can produce significantly asymmetric charge storage in the ONO film.

Accordingly, there is an urgent need for a fabrication method for forming twin-bit floating gate memory cells and arrays that avoid or overcome some or all of the above deficiencies with prior art methods.

SUMMARY OF THE INVENTION

The legal scope of the invention is set out only in the claims, and the following is only a rough description of certain aspects. This description should not be read to narrow or enlarge the scope of protection as set forth in the claims.

Roughly described, the invention overcomes at least some of the above deficiencies in prior art methods for fabricating floating gate memory devices. In an embodiment, a substrate has an ONO layer provided thereon. The ONO is removed in the logic area of the substrate, and replaced by an oxide. This oxide will become the gate oxide for transistors in the logic area. The entire wafer is then covered with a protective layer of, for example, polysilicon. In the memory area, buried diffusion oxide features are formed above buried diffusion regions, and an additional material, again preferably polysilicon, is formed over the entire wafer. The additional material is deposited in such a way as to form spacer features against the sidewalls of the buried diffusion oxide features. The ONO is then etched to form the isolation trenches between the twin bits of the memory cells. The etch of the ONO layer is done through the polysilicon liner above the ONO layer, using the polysilicon spacers against the sidewalls of the buried diffusion oxide features as a self-aligned mask. The polysilicon spacers also protect the top oxide layer of the ONO during this etching step. An insulator is then formed in the isolation trenches and a gate conductor is formed above.

The charge storage structure resulting from this embodiment is flat rather than curved. In addition, the process integrates well into the fabrication process used for the logic areas of the device, for example because the thickness of the top ONO oxide layer in the memory area and the thickness of the gate oxide layer of logic transistors are controlled independently, and because the top surface of the gate oxide in the logic area can be cleaned without damaging the delicate top ONO oxide layer, which is covered by other layers at the time the gate oxide is cleaned. Furthermore, the process requires only a minimum of high-resolution masking steps.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

FIGS. 1–13 illustrate the process flow of an embodiment of the invention. Beginning with FIG. 1, a material is formed that includes a substrate 110 with a charge storage structure 112 formed on the surface. As used herein, since various embodiments of the invention can involve different structures formed above or below the surface of the substrate, no distinction is made herein between structures formed "in" or "on" the substrate. The two terms are used interchangeably herein.

Figure 1:
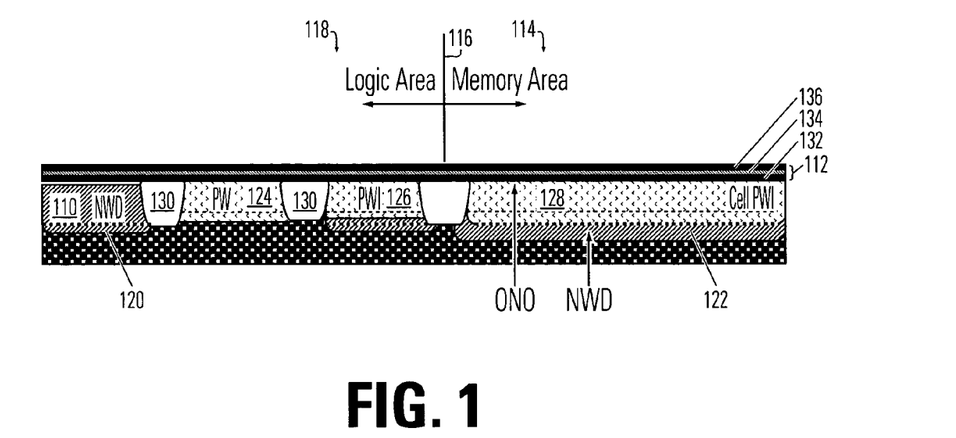
FIGS. 1–13 illustrate in cross-sectional view an embodiment of a process flow in accordance with the invention.

The material of FIG. 1 will be used to form both logic and memory. In the illustration of FIG. 1, the memory area is area 114, shown to the right of dividing line 116, and the logic area is 118, shown to the left of dividing line 116. Basically, the memory area differs from the logic area in that the memory area will contain floating gate transistors, whereas the logic area will contain conventional field effect transistors (FET's). The substrate 110 as shown in FIG. 1 already includes the N-well diffusions 120 and 122 in the logic and memory areas, respectively; a P-well 124 in the logic area 118; P-well implants 126 and 128 in the logic and memory areas, respectively, and field oxides 130 in the logic area 118. Although the memory area and the logic area are shown as two distinct regions in the figures, it will be understood that a single wafer could include multiple logic areas interspersed with memory areas or vice-versa.

The charge storage structure 112 is a layer that stores charge in a nonvolatile state. Typically it includes three sublayers: a bottom dielectric layer 132, a middle charge-storage layer 134, and a top dielectric layer 136. The bottom and top dielectric layer's 132 and 136 are typically formed of a silicon oxide, and the middle charge storage layer 134 can be either a conductive material (for example polysilicon or a metal) or a charge "trapping" material such as the dielectric is silicon nitride (SiN), Al2O3, HFOx, ZrOx, or other metal oxides. In other embodiments, the charge trapping structure 112 need not includes three distinct sublayers as shown in FIG. 1. The latter kinds of charge trapping structures include, for example, layers made of a dielectric treated in such a way as to form charge trapping sites dispersed throughout all or part of the material in the layer. As used herein, the term "layer" can include sublayers, which themselves can be considered herein to constitute layers. Also as used herein, a "layer" may be patterned or unpatterned. By itself the term does not imply either condition.

In the embodiment to FIG. 1, the charge storage structure 112 is a three-layer structure in which the top and bottom dielectric layers 136 and 132 are silicon oxides, and the middle charge storage layer is silicon nitride. Thus the charge storage structure 112 is a three layer composite oxide-nitride-oxide (ONO) structure. Processes for forming ONO structures on a silicon substrate are well known.

Figure 2:
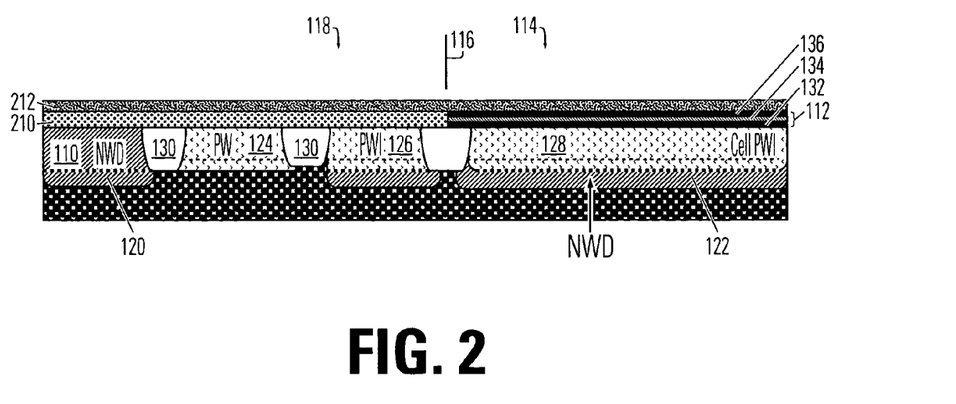

As mentioned, in certain conventional processes, when integrated into a logic process, there is an interdependence between the thickness of the top oxide layer of the ONO structure and they gate oxide used in conventional FETs in the logic areas. In particular, in many processes, oxide is deposited in a single layer on all areas of the wafer, causing the ONO top oxide to have the same thickness as the gate oxide in the logic areas. To avoid this problem, after the ONO deposition of FIG. 1, photoresist is formed over the ONO and removed above only the logic areas 118. The ONO composite layer is then etched away as shown in FIG. 2, only above the logic areas 118 using for example a CH4 dry etch. Preferably, the etch is stopped when less than 50 Angstroms of substrate silicon has been lost. The gate oxide layer 210 is then formed over the exposed silicon by an oxidation method, to thickness of approximately 150 Angstroms. Using this method, therefore, the thickness of the gate oxide layer 210 can be completely independent of the thickness of top oxide layer 136 of the composite layer 112 in the memory area 114.

Also as shown in FIG. 2, the photoresist over the memory area is then removed and a polysilicon layer 212 is formed over the entire surface of the device. In other embodiments, silicon germanium (SiGe) can be used here instead of polysilicon. The polysilicon layer 212 is deposited to a thickness of approximately 50 to 1000 Angstroms, for example using an SiH4 furnace process. It will be seen that the polysilicon layer 212 performs a function of masking the logic areas 118 during certain etches of the memory area 114. The polysilicon layer 212 also protects the delicate top surface of the top oxide layer 136 of the ONO composite layer 112 during etching of the isolation regions and during subsequent cleaning of the gate oxide in the logic areas 118.

Figure 3:
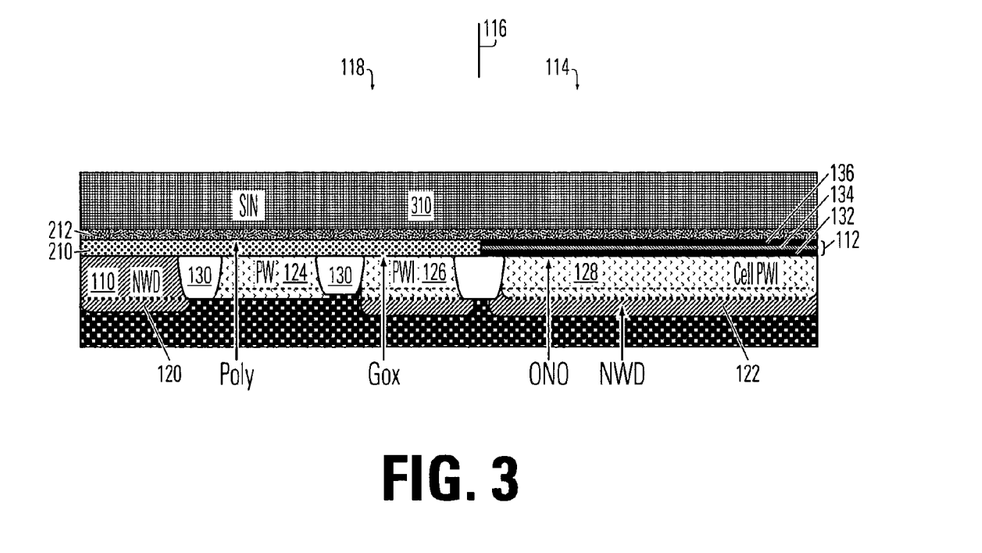

In FIG. 3, a sacrificial layer 310, which may be silicon nitride, is deposited to an approximate thickness of 1000–3000 Angstroms. The silicon nitride layer may be deposited using, for example, an NH3/SiH2Cl2/N2 furnace process.

Figure 4:
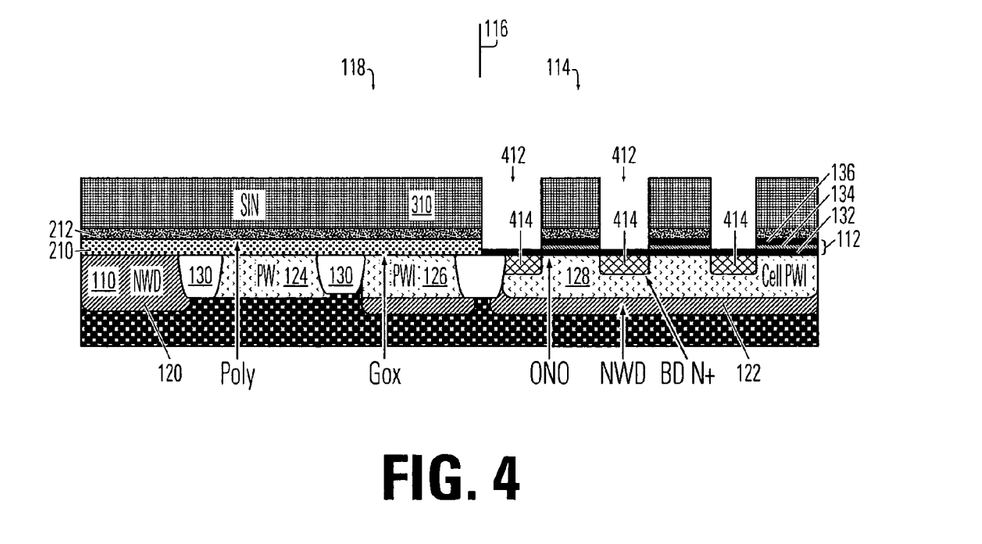

In FIG. 4, photoresist is applied over the entire surface of the device, and a mask is used to expose regions for buried diffusions. The buried diffusions regions will be elongated conductive N+ doped lines (bit lines) extending under more than one memory cell. These regions are then etched by a four-step process: first, CH4+HBr is used to etch through the silicon nitride sacrificial layer 310. Second, an HBr/O2 plasma is used to etch through the polysilicon layer 212, stopping on the top oxide layer 136. Third, CF4 is used to etch through the top oxide layer to stop on the silicon nitride charge storage layer 134, and finally an etching gas atmosphere containing HBr, SF6 and CHF3 is used to etch through the silicon nitride layer 134 to stop at the bottom oxide 132. At this point the device has been openings 412 in the film above buried diffusion line regions. The buried diffusions lines 414 are now implanted through the openings 412 using the silicon nitride and polysilicon layer's 310 and 212 as a mask. Implantation can be accomplished using a rapid thermal pocket implant process, such as furnace anneal, furnace oxidation and rapid thermal oxidation. The buried diffusion lines 414 defined the lateral extent of the memory cell transistors in the memory area 114, since for each memory cell, one of the buried diffusion regions 414 acts as the source while the other acts as the drain. The segment of substrate 110 which extends laterally between the two buried diffusion lines 414 constitutes a channel of the transistor, and the segment of the ONO composite layer extending laterally between each pair of buried diffusion regions contains the floating gate.

As used herein, a particular patterned layer is "used as a mask" for a particular process step if it is the top layer present when the particular process step is performed, and also if it is only an intermediate layer present when the particular process step is performed, as long as any superposing layers are patterned the same as the particular layer. In other words, as used herein, if the structure includes two commonly-patterned layers, then each of them individually, as well as both of them together, are all considered herein to act as a "mask" for the particular process step. The presence of a superposing layer having the same pattern as the particular layer does not prevent the particular layer from being "used as a mask" for the particular process step. Also as used herein, layers which are termed "above" or "below" other layers, can in various embodiments be separated from such other layers by one or more intervening layers. If no intervening layer is intended, then the terms "immediately above" or "immediately below" are used herein. The same interpretation is intended for layers described herein as "superposing", "underlying" or "over" another layer.

Figure 5:
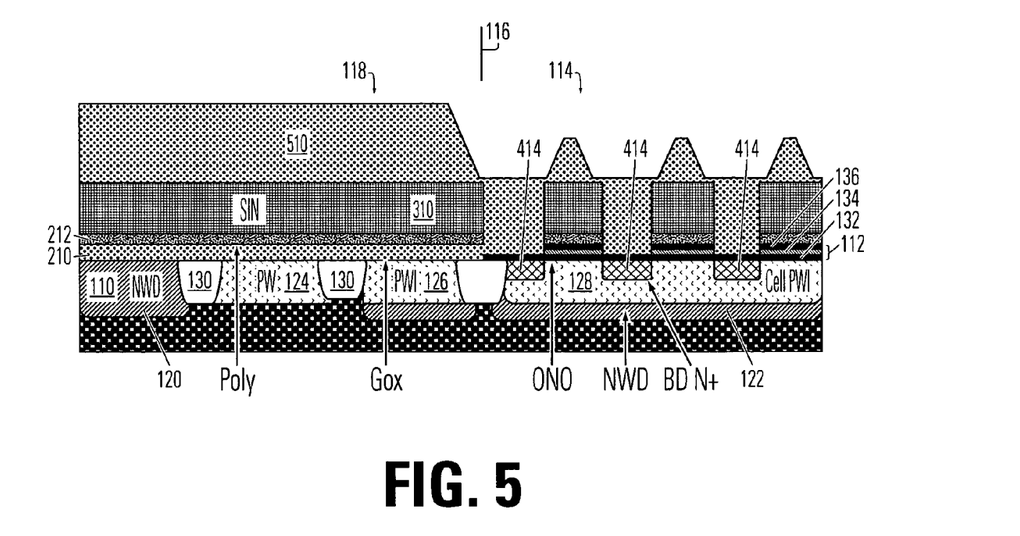
Figure 6:
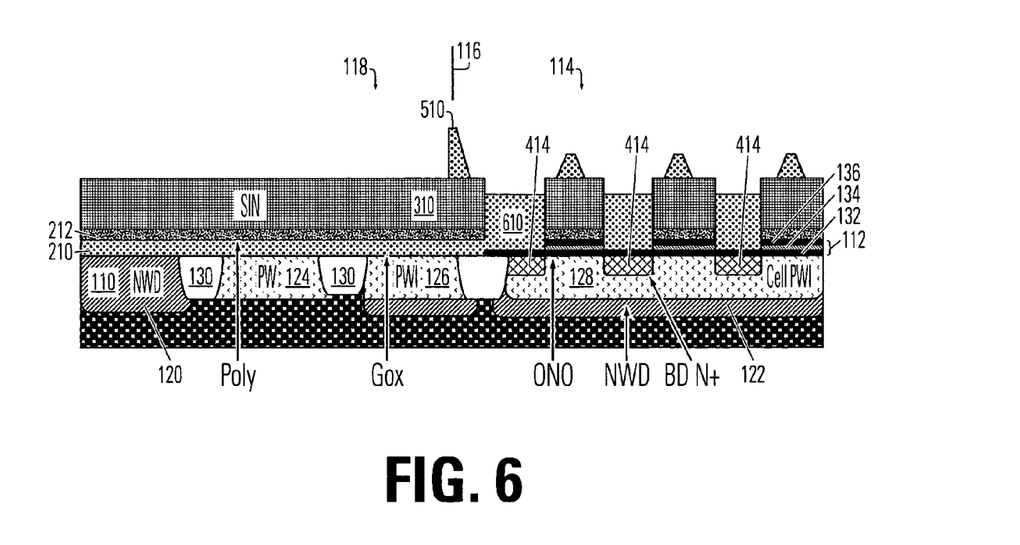

In FIG. 5, another oxide layer 510 is deposited by a high-density plasma CVD, to a thickness on the order of 1000–3000 Angstroms. The layer 510 is formed over the entire surface of the device, and fills the openings over the buried diffusion lines 414. In FIG. 6, photoresist is applied over the structure and opened over the logic area 118. The oxide layer 510 is then etched back over the logic area 118 to stop on the silicon nitride layer 310. The latter etch can be accomplished, for example, using a dry etch having a CF4+CHF3 main step with an etch endpoint and a C4F8+N2+CO over-etch step with time mode control. The photoresist is then removed over the entire wafer and the wafer is subjected to an oxide dip to reveal the silicon nitride edge for liftoff. At this point the oxide 510 remaining in the openings 412 above the buried diffusion lines 414 form oxide features 610 which will be used in a subsequent to self-aligned step. As can be seen, the oxide features 610 have sidewalls extending higher than the top surface of the top oxide layer 136 of the composite film 112.

Figure 7:
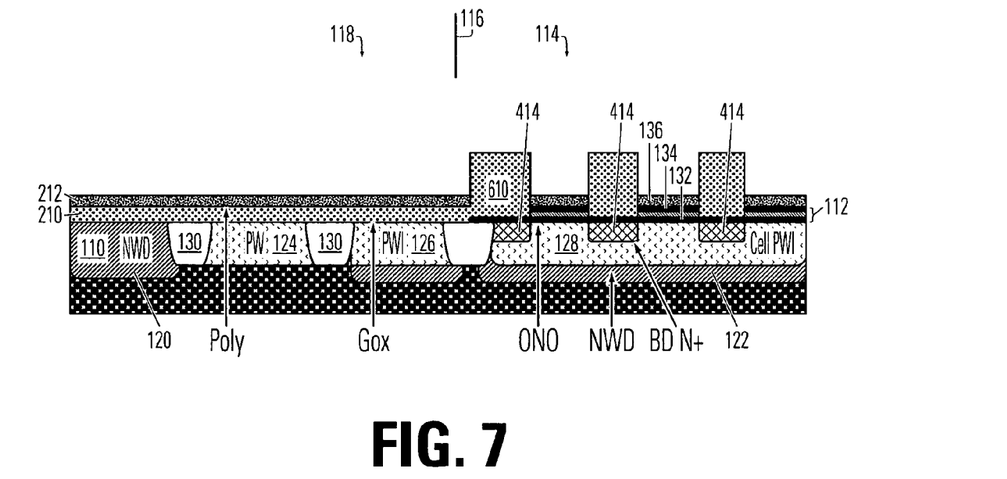
Figure 8:
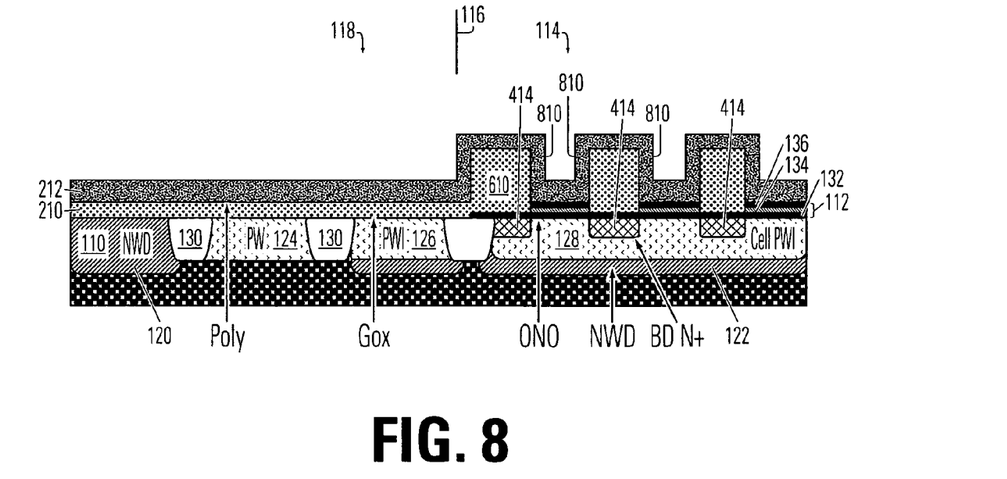
Figure 9:
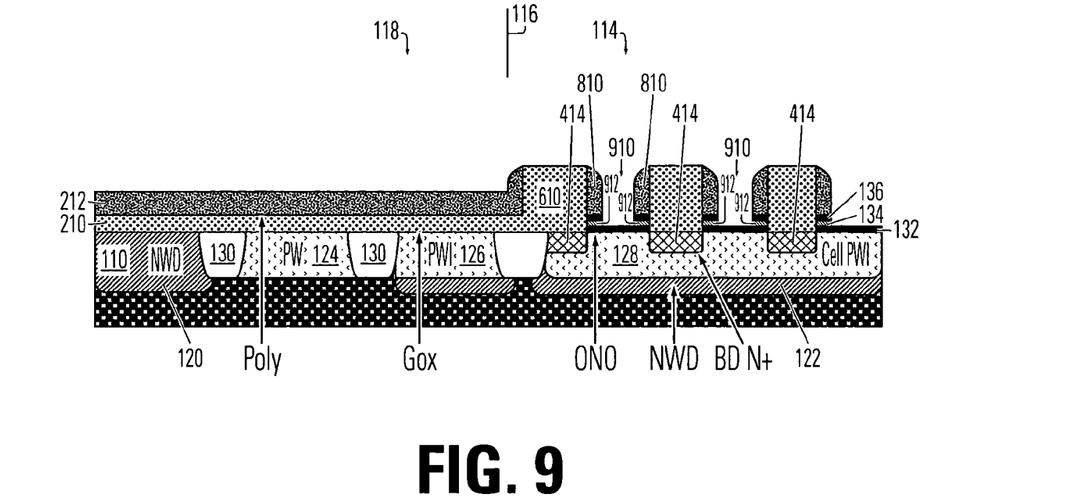

In FIG. 7, the sacrificial silicon nitride layer 310 is removed by a liftoff technique, for example using DHF+H3PO4+SC1. At this point the gate oxide 210 and a layer of polysilicon 212 remains over the logic area 118 of the device, and the polysilicon layer 212 also remains protecting the top oxide layer 136 of the ONO composite film 112, in the memory area 114. In FIG. 8, additional liner polysilicon is deposited over the entire wafer to an additional thickness of approximately 50–800 Angstroms, using a SiH4 furnace process. The liner polysilicon layer thickens the polysilicon layer 212 on the horizontal surfaces above the gate oxide layer 210 and ONO composite layers 112. It also forms a layer on the horizontal surfaces above the oxide features 610 in the memory area 114, and further forms polysilicon spacers 810 on the sidewalls of the oxide features 610. In some embodiments, the liner layer formed in FIG. 8 need not be the same material as the polysilicon layer 212 applied in FIG. 2. But where they are the same material, the spacers features 810 have a thickness in the vertical dimension which is greater than the thickness of the protective liner layer in the vertical dimension over the ONO composite regions, so that an anisotropic etch will etch through it over the ONO composite regions before etching through the spacer features. As used herein, "vertical" means essentially normal to the substrate major surface. The "vertical" direction may or may not coincide with the direction normal to any particular layer of film at that point, since the surface of a film may be slanted or uneven due to various processing steps and various non-coplanar features underlying the film. "Lateral" means substantially parallel to the major surface of the substrate.

Thus after the processing steps of FIG. 8, the wafer includes the substrate 110 having a memory area 114 and a logic area 118. Within the memory area the wafer has a charge storage structure 112 comprising ONO, and a protective liner layer 212 over the charge storage structure. Buried diffusion oxide features 610 overly respective buried diffusion lines 414 in the substrate and extend vertically through the charge storage structure 112 down through the nitride sublayer 134. The buried diffusion oxide features 610 have sidewalls extending higher than the top surface of the charge storage structure 112 adjacent to the buried diffusion oxide features 610, and further have polysilicon spacer features 810 over the charge storage structure 112 against the sidewalls of the buried diffusion oxide features 610. In the logic area 118, the polysilicon liner layer 212 overlies and protects the gate oxide layer 210, which overlies the substrate 110.

In FIG. 9, photoresist is again applied to the entire surface of the wafer and then opened up over the memory area 114 only. The memory region 114 is then etched anisotropically to form a self-aligned isolation trench 910 in each of the cells. This process step isolates the gate nodes in the ONO charge trapping material. These gates in the ONO can control the electric field for electrons or holes to trap in the ONO. This etch can be accomplished, for example, by first using an HBr/O2 plasma to etch through the polysilicon layer 212, stopping on the top oxide layer 136. A CF4-containing gas is then used to etch through the top oxide layer to stop on the silicon nitride charge storage layer 134, and an etching gas atmosphere containing HBr, SF6 and CHF3 is then used to etch through the silicon nitride layer 134 to stop at the bottom oxide 132. In another embodiment, a further etch can take place to break all the way through the bottom oxide layer 132 if desired. The process steps of FIG.

9 use the spacer features 810 as a mask for the self aligned etch, thereby protecting the delicate top oxide 136 from damage. As can be seen, the process steps of FIG. 9 results in two narrow charge storage regions 912 in each memory cell, against facing sidewalls of opposite oxide features 610, and separated from each other electrically by an isolation trench 910.

Figure 10:
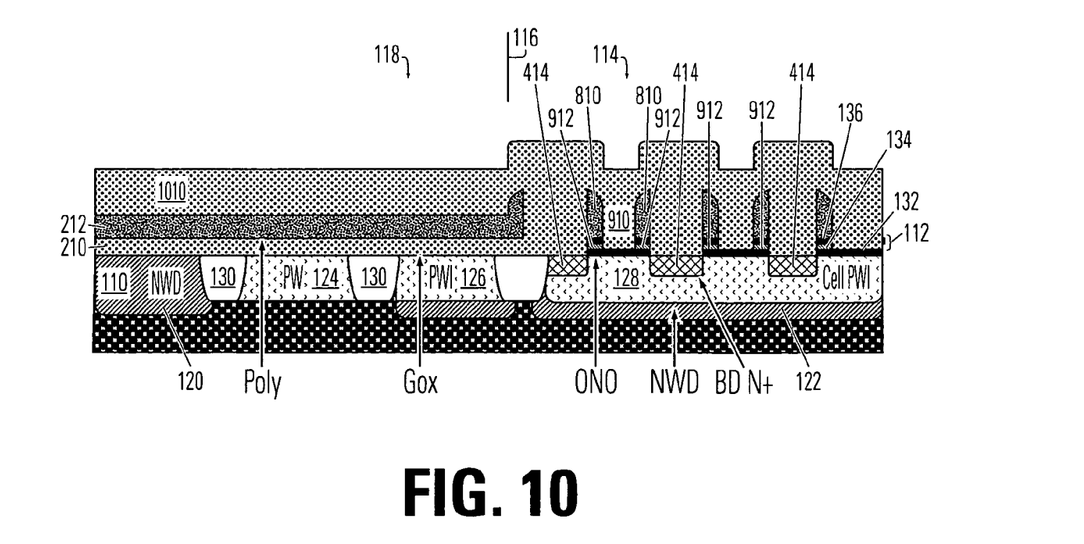
Figure 11:
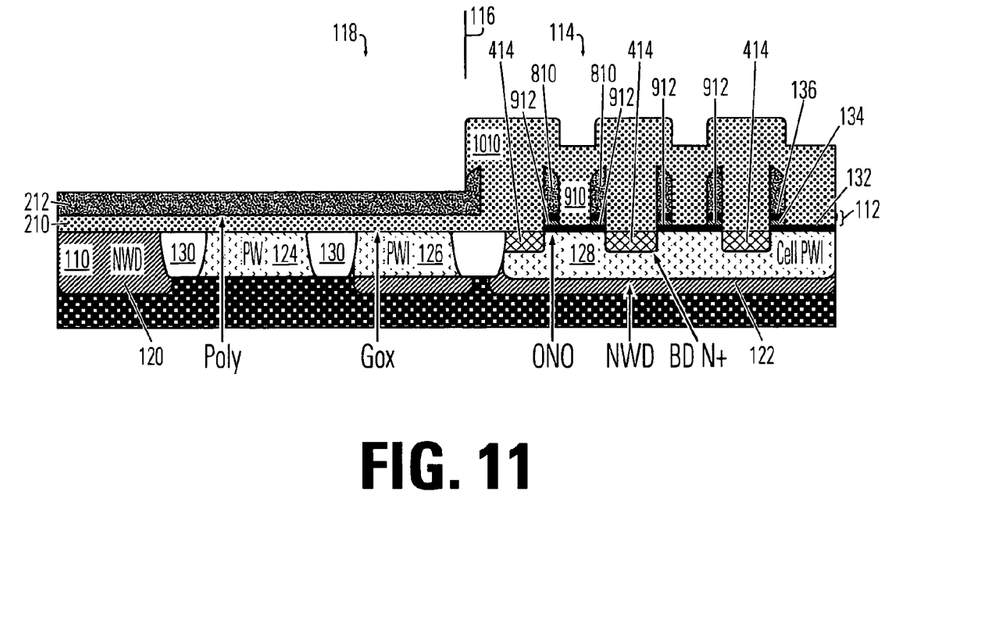
Figure 12:
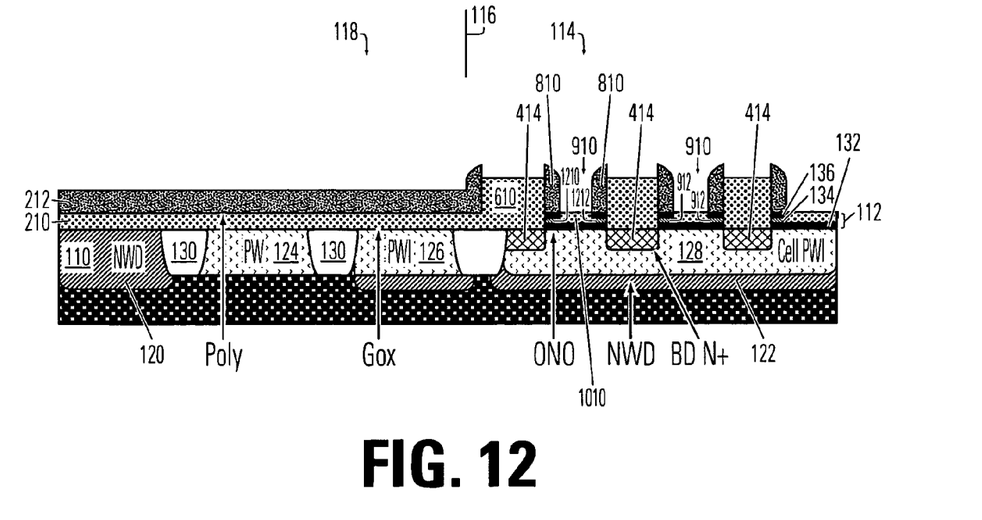

In FIGS. 10–12, a 3-step process is used to fill the isolation trenches 910. First, in FIG. 10, the photoresist is removed from the entire wafer and a new layer 1010 of insulating material is formed on the surface to a thickness of approximately 500–2000 Angstrom. Preferably the new layer 1010 is an oxide formed by a TEOS process. The layer fills the trenches 910, but also overlies all other lateral surfaces on the wafer. In FIGS. 11 and 12, the oxide 1010 is etched back in the logic and memory areas independently. More particularly, in FIG. 11, photoresist is applied to the entire wafer, and opened over only the logic area 118. The exposed oxide is then etched all the way down to the polysilicon layer 212, thereby completely removing the oxide layer 1010 in the logic area 118. FIG. 12, the remaining photoresist is removed, exposing the oxide layer 1010 in the memory area 114. An oxide dip is used to etch back this oxide. This etch is performed until the oxide 1010 in the trenches 910 has an elevation on the wafer approximately equal to the top surface of the composite layer 112.

In other embodiments this etch can be stopped while the oxide 1010 in the trenches is still at a higher elevation, or after the oxide in the trenches has been etched down below the top surface of the composite layer 112. The insulator in the trenches should, however, remain at least higher than the top surface of the charge storage material in the charge storage structure 112, in order to maintain insulation between the charge storage material and the gate conductor (applied next). In the example of FIG. 10, in which the charge storage material is a middle layer 134 sandwiched between two insulating layers 132 and 136, the oxide 1010 remaining in the trenches 910 after the etch of FIG. 12 need only have an elevation higher than the top surface of the charge storage layer 134. Nevertheless, it is preferable that the etch be stopped when the top surface of the oxide 1010 in the trenches is substantially coplanar with the top surface of the composite layer 112, providing a coplanar bottom surface of the control gate across the entire lateral extent of the channel.

The top surface of the isolation trench oxide 1010 is now cleaned, preferably using HF, before application of control gate polysilicon. The polysilicon layer 212 protects the gate oxide layer 210 from damage during this cleaning step.

As shown in FIG. 12, the oxide dip leaves a structure in which each memory cell is bounded laterally by a pair of buried diffusions 414 (bit lines), and has a composite film 112 extending laterally between the two buried diffusions 414. An oxide-filled trench 910 isolates two charge storage regions 1210 and 1212 of the composite film 112, each of which is superposed by a respective polysilicon spacer 810. The polysilicon spacers 810 are conductive, but are separated from the charge storage regions 1210 and 1212 by top oxide sub-layers 136 of the composite film 112. In the logic area 118, the gate oxide layer 210 is superposed by a polysilicon layer 212.

In one embodiment, the spacers 810 are insulating rather than conductive material. In such an embodiment the spacers would now be removed. Preferably the spacers are conductive however, and even more preferably polysilicon, thereby avoiding any need to remove them now.

Figure 13:
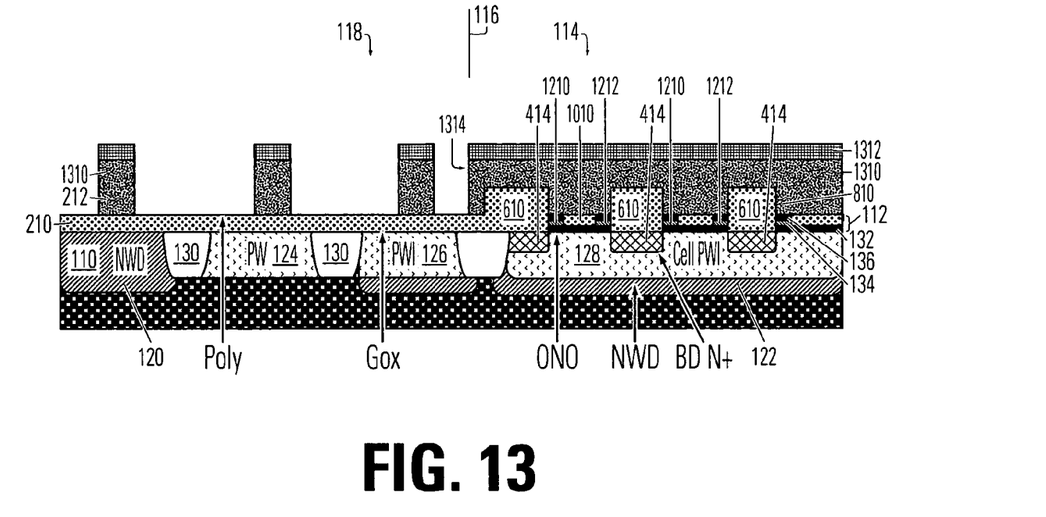

In FIG. 13, another layer 1310 of polysilicon is deposited over the entire wafer, followed by a layer 1312 of Tungsten Silicide (WSi). The polysilicon layer 1310 fills the gaps between the polysilicon spacers 810, thereby forming a uniform conductive material over the entire channel region of each memory cell. The combined polysilicon/WSi layer 1310/1312 also extends to a higher elevation than the oxide features 610 on the substrate, so that it may be patterned to form control gate conductors for the memory array. The combined polysilicon/WSi layer 1310/1312 is then photo-lithographically patterned to form control gates on the FET transistors in the logic area 118, as well as other conductive lines in the logic area 118, and to form the control gate conductors 1314 in the memory area 114.

As can be seen, the embodiment of FIGS. 1–13 produces twin bit memory cells in which the charge storage structures are flat, i.e. have a substantially constant thickness throughout their lateral extent, and therefore it is easier to control electron and hole distribution within the charge storage regions. (As used herein, a layer having "substantially constant thickness" means to within manufacturing tolerances. For example, a layer laid down in a single process step, which distributes the deposited material relatively evenly over the entire surface of interest, will likely have a "substantially constant thickness." It may not have a "substantially constant elevation," however, for example if the layer is formed over a bump or other elevated feature in an underlying layer.) The flat charge storage structures result from their formation early in the process on a flat underlying material (the substrate), followed by subsequent selective etching, rather than trying to form the isolated charge storage structures in a later step.

The embodiment of FIGS. 1–13 also integrates well into the fabrication process used for the logic areas of the device. In particular, for example, the thickness of the top ONO oxide layer and the thickness of the gate oxide layer of logic transistors are controlled independently. As another example, the top surface of the gate oxide in the logic area can be cleaned without damaging the delicate top ONO oxide layer, which is covered by other layers at the time the gate oxide is cleaned. Nor does the step of etching twin bit isolation regions into the ONO layer damage the top oxide layer of the ONO segments that are to remain, because those segments are covered and protected by the polysilicon spacers at the time of the etch.

The embodiment of FIGS. 1–13 also requires only two high-resolution masking steps to perform the steps shown: the buried diffusion bit line definition in FIG. 4, and the final patterning of the poly 3 control gates in FIG. 13. The definition of the isolation trenches in the composite layer is performed by a self-aligned etch, so no separate high resolution masking step is required for this step.

Figure 14:
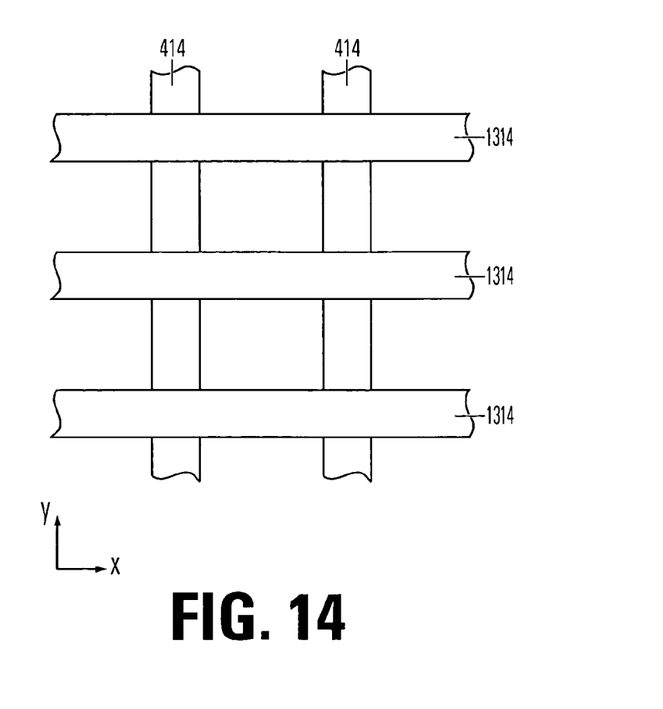
FIG. 14 is a plan view of pertinent features of the structure of FIG. 13.

FIG. 14 is a top view of a portion of the memory area 114 of the device after the patterning steps of FIG. 13. As can be seen, the memory cells are organized into a regular array, with each bit line diffusion 414 extending through more than one cell in the 'y' dimension, crossing under more than one control gate line 1314. As used herein, an "array" of memory cells simply means more than one memory cell. Typically an array has regularity of structure, such as that shown in FIG. 14, but regularity is not essential.

As used herein, when "first" or "second", and so on, are used to describe layers or other elements, these words are intended only to provide structural differentiation and handles so the elements can be referred back to unambiguously later. They are not intended to require a temporal sequence.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, while specific illustrative process chemistries are set forth above for performing particular steps, numerous alternative process chemistries and mechanisms for performing such steps will be apparent to the reader. In addition, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method for fabricating a device having a twin bit floating gate memory cell, comprising the steps of:
   providing a material including a substrate having a memory area, the substrate having formed thereon within the memory area a composite charge storage structure and a protective liner layer over the composite charge storage structure, the material further including, within the memory area, buried diffusion oxide features least partially overlying respective buried diffusion regions in the substrate and extending vertically through the composite charge storage structure at least down through all charge storage sublayers of the composite charge storage structure, the buried diffusion oxide features having sidewalls extending higher than the top surface of the composite charge storage structure adjacent to the buried diffusion oxide features, the composite charge storage structure further having a subject segment extending laterally between two of the buried diffusion oxide features, the material further including spacer features over the composite charge storage structure against the sidewalls of the buried diffusion oxide features;
   etching a trench through the subject segment of the composite charge storage structure, at least down through all charge storage sublayers of the composite charge storage structure, using the spacer features as a mask;
   forming an insulator in the trench, at least to an elevation above the top surface of the highest charge storage sublayers of the composite charge storage structure; and
   forming a gate conductor overlying at least a portion of the subject segment of the composite charge storage structure.

2. A method according to claim 1, wherein the composite charge storage structure in the material as provided in the step of providing comprises a composite layer having a bottom insulating sublayer underlying a charge storage sublayer, the charge storage sublayer underlying a top insulating sublayer,
   wherein the step of etching a trench etches the trench at least down through the charge storage sublayer of the composite layer,
   and wherein the step of forming an insulator in the trench forms the insulator at least to an elevation above the top surface of the charge storage sublayer.

3. A method according to claim 2, wherein the step of forming an insulator in the trench forms the insulator to an elevation that is substantially coplanar with the top surface of composite charge storage structure.

4. A method according to claim 2, wherein the charge storage sublayer in the material as provided in the step of providing comprises a charge trapping material.

5. A method according to claim 4, wherein the charge trapping material comprises a nitride.

6. A method according to claim 1, wherein the step of providing a material comprises the steps of:
   providing a preliminary material including the substrate, the composite charge storage structure, the protective liner layer and the buried diffusion oxide features; and
   forming the spacer features over at least part of the preliminary material.

7. A method according to claim 6, wherein the step of forming the spacer features over at least part of the preliminary material comprises the step of forming a spacer material over the entire lateral extent of the subject segment of the composite charge storage structure, including against the sidewalls.

8. A method according to claim 7, wherein the spacer material and the protective liner material are essentially the same material.

9. A method according to claim 1, wherein the spacer material and the protective liner material are essentially the same material.

10. A method according to claim 1, wherein the spacer features are conductive.

11. A method according to claim 10, wherein the spacer features and the gate conductor are formed of essentially the same material.

12. A method according to claim 1, wherein the step of providing a material comprises the steps of:
   forming the composite charge storage structure over the substrate, at least within the memory area;
   forming a sacrificial layer over the composite charge storage structure, at least within the memory area;
   forming openings over the buried diffusion regions and through both the first sacrificial layer and the composite charge storage structure;
   implanting buried diffusions using the first sacrificial layer as a mask;
   forming the buried diffusion oxide features in the openings to an elevation higher than the top surface of the composite charge storage structure; and
   removing the sacrificial layer, at least within the memory area.

13. A method according to claim 12, wherein the step of forming the buried diffusion oxide features in the openings comprises the steps of:
   depositing oxide in the openings and over at least part of the sacrificial material, such that the oxide fills the openings to an elevation higher than the top surface of the sacrificial layer; and
   etching the oxide back until the oxide in the openings has an elevation below the top surface of the sacrificial layer and parts of the sacrificial layer are exposed.

14. A method according to claim 1, wherein the step of forming an insulator in the trench comprises the steps of:
   forming oxide in the trench and over the spacer features and over the buried diffusion oxide features; and etching the oxide back until the oxide fills the trench to substantially the same elevation as the top surface of the top insulating sublayer of the composite layer and the spacer features are exposed.

15. A method according to claim 14, wherein the step of forming a gate conductor comprises the step of forming gate conductor material over the spacer features and the oxide in the trench and the buried diffusion oxide features such that the gate conductor material is in electrical contact with the spacer features.

16. A method according to claim 15, wherein the gate conductor material and the spacer features are made from essentially the same material.

17. A method according to claim 1, wherein the step of forming a gate conductor forms the gate conductor to overly also at least a portion of the buried diffusion oxide features.

18. A method according to claim 1, comprising the step of forming a gate oxide in a logic area different from the memory area, the gate oxide having a thickness different from that of the top insulating layer of the composite layer in the memory area.

19. A method according to claim 18, wherein the gate oxide has a thickness substantially greater than that of the top insulating layer of the composite layer in the memory area.

20. A method according to claim 1, wherein the material further has a logic area, and wherein the step of providing a material comprises the steps of:
over the substrate, forming the composite layer;
in the logic area, removing the composite layer at least down to the bottom insulating sublayer; and
forming a gate oxide in the logic area.

21. A method according to claim 20, wherein the step of providing a material further comprises the step of forming the protective liner layer over the composite layer in the memory area and over the gate oxide in the logic area.

22. A method according to claim 21, wherein the step of providing a material further comprises the step of forming the buried diffusion oxide features and the spacer features in the memory area after the step of forming the protective liner layer.

23. A method according to claim 22, further comprising, after the step of providing a material and before the step of etching a trench, the step of forming a photoresist over the substrate, patterned to protect the logic area during the step of etching a trench.

24. A method according to claim 23, further comprising the step of removing the photoresist after the step of etching a trench and before the step of forming a gate conductor.

25. A method according to claim 21, further comprising the step of exposing the gate oxide over at least selected regions in the logic area.

26. A method for fabricating a device having an array of twin bit floating gate memory cells, comprising the steps of:
providing a material including a substrate having a memory area having a plurality of bit cells arranged in an array, the substrate having formed thereon within the memory area a composite charge storage structure and a protective liner layer over the composite charge storage structure, the material further including, within the memory area, oxide features least partially overlying respective bit lines buried in the substrate and extending vertically through the composite charge storage structure at least down through all charge storage sublayers of the composite charge storage structure, the buried bit lines each extending laterally through a plurality of memory cells in the array, the oxide features having sidewalls extending higher than the top surface of the composite charge storage structure adjacent to the oxide features, each bit cell in the memory area being defined laterally by a respective adjacent pair of the oxide features and a respective subject segment of the composite charge storage structure extending laterally between respective adjacent pair of the oxide features, each cell further including spacer features over the composite charge storage structure against the facing sidewalls of the oxide features defining the cell;
etching a trench through the subject segment of the composite charge storage structure of each of the cells, at least down through all charge storage sublayers of the composite charge storage structure, using the spacer features as a mask;
forming an insulator in each of the trenches, at least to an elevation above the top surface of the highest charge storage sublayers of the composite charge storage structure; and
forming a gate conductor overlying at least a portion of the subject segment of the composite charge storage structure in each of the cells.

27. A method according to claim 26, wherein the composite charge storage structure in the material as provided in the step of providing comprises a composite layer having a bottom insulating sublayer underlying a charge trapping sublayer, the charge trapping sublayer underlying a top insulating sublayer,
wherein the step of etching a trench etches the trench at least down through the charge trapping sublayer of the composite layer,
and wherein the step of forming an insulator in the trench forms the insulator to an elevation that is substantially coplanar with the top surface of composite charge storage structure.

28. A method according to claim 26, wherein the step of providing a material comprises the steps of:
providing a preliminary material including the substrate, the composite charge storage structure, the protective liner layer and the oxide features; and
forming the spacer features over at least part of the preliminary material.

29. A method according to claim 28, wherein the step of forming the spacer features over at least part of the preliminary material comprises the step of forming a spacer material over the entire lateral extent of the subject segments of the composite charge storage structure, including against the sidewalls.

30. A method according to claim 26, wherein the spacer material and the protective liner material are essentially the same material.

31. A method according to claim 26, wherein the spacer features and the gate conductor are conductive and are formed of essentially the same material.

32. A method according to claim 26, wherein the step of providing a material comprises the steps of:
forming the composite charge storage structure over the substrate, at least within the memory area;
forming a sacrificial layer over the composite charge storage structure, at least within the memory area;
forming openings over the buried bit lines and through both the first sacrificial layer and the composite charge storage structure;
implanting buried bit line diffusions using the first sacrificial layer as a mask;

forming the oxide features in the openings to an elevation higher than the top surface of the composite charge storage structure; and removing the sacrificial layer, at least within the memory area.

33. A method according to claim 32, wherein the step of forming the oxide features in the openings comprises the steps of:

depositing oxide in the openings and over at least part of the sacrificial material, such that the oxide fills the openings to an elevation higher than the top surface of the sacrificial layer; and etching the oxide back until the oxide in the openings has an elevation below the top surface of the sacrificial layer and parts of the sacrificial layer are exposed.

34. A method according to claim 26, wherein the step of forming an insulator in each of the trenches comprises the steps of:

forming oxide in each of the trenches and over the spacer features and over the oxide features; and etching the oxide back until the oxide fills the trenches to substantially the same elevation as the top surface of the top insulating sublayer of the composite layer and the spacer features are exposed.

35. A method according to claim 34, wherein the gate conductor material and the spacer features are made from essentially the same material, and wherein the step of forming a gate conductor comprises the step of forming gate conductor material over the spacer features and the oxide in the trenches and the oxide features such that the gate conductor material is in electrical contact with the spacer features.

36. A method according to claim 26, wherein the step of forming a gate conductor forms the gate conductor to overly also at least a portion of the oxide features.

37. A method according to claim 26, comprising the step of forming a gate oxide in a logic area different from the memory area, the gate oxide having a thickness substantially greater than that of the top insulating layer of the composite layer in the memory area.

38. A method according to claim 26, wherein the material further has a logic area, and wherein the step of providing a material comprises the steps of:

over the substrate, forming the composite layer;

in the logic area, removing the composite layer at least down to the bottom insulating sublayer; and forming a gate oxide in the logic area.

39. A method according to claim 38, wherein the step of providing a material further comprises the steps of:

forming the protective liner layer over the composite layer in the memory area and over the gate oxide in the logic area; and forming the oxide features and the spacer features in the memory area after the step of forming the protective liner layer.

40. A method according to claim 39, further comprising:

after the step of providing a material and before the step of etching the trenches, the step of forming a photoresist over the substrate, patterned to protect the logic area during the step of etching the trenches; and removing the photoresist after the step of etching the trenches and before the step of forming a gate conductor.

41. A method for fabricating a device having a twin bit floating gate memory cell, comprising the steps of:

providing a material including a substrate having a memory area, the substrate having formed thereon within the memory area an oxide-nitride-oxide composite film and a polysilicon liner layer over the composite film, the material further including, within the memory area, buried diffusion oxide features least partially overlying respective buried diffusion bit lines in the substrate and extending vertically through the composite film at least down through the nitride sublayer of the composite film, the buried diffusion oxide features having sidewalls extending higher than the top surface of the composite film adjacent to the buried diffusion oxide features, the composite film further having a subject segment extending laterally between two of the buried diffusion oxide features, the material further including polysilicon spacer features over the composite film against the sidewalls of the buried diffusion oxide features;

etching a trench through the subject segment of the composite film, at least down through the nitride sublayer of the composite film, using the spacer features as a mask;

forming oxide in the trench; and forming a polysilicon gate conductor overlying at least a portion of the subject segment of the composite film.

42. A method according to claim 41, wherein the step of providing a material comprises the steps of:

providing a preliminary material including the substrate, the composite film, the polysilicon liner layer and the buried diffusion oxide features; and forming a spacer material over the entire lateral extent of the subject segment of the composite film, including against the sidewalls.

43. A method according to claim 41, wherein the step of providing a material comprises the steps of:

forming the composite film over the substrate, at least within the memory area;

forming a sacrificial layer over the composite film, at least within the memory area;

forming openings over the buried diffusion lines and through both the first sacrificial layer and the composite film;

implanting buried diffusions using the first sacrificial layer as a mask;

forming the buried diffusion oxide features in the openings to an elevation higher than the top surface of the composite film; and removing the sacrificial layer, at least within the memory area.

44. A method according to claim 41, wherein the step of forming oxide in the trench comprises the steps of:

forming oxide in the trench and over the spacer features and over the buried diffusion oxide features; and etching the oxide back until the oxide fills the trench to substantially the same elevation as the top surface of the composite film and the spacer features are exposed, and wherein the step of forming a gate conductor comprises the step of forming gate conductor material over the spacer features and the oxide in the trench and the buried diffusion oxide features such that the gate conductor material is in electrical contact with the spacer features.

45. A method according to claim 41, wherein the material further has a logic area, and wherein the step of providing a material comprises the steps of:

over the substrate, forming the composite film;

throughout the logic area, removing at least the top oxide sublayer and the nitride sublayer of the composite film;

forming a gate oxide in the logic area immediately overlying the top surface remaining after the step of removing;

forming the polysilicon liner layer over the composite film in the memory area and over the gate oxide in the logic area; and forming the buried diffusion oxide features and the spacer features in the memory area after the step of forming the polysilicon liner layer.

* * * * *